US012713626B2

(12) United States Patent
Chen et al.

(10) Patent No.: US 12,713,626 B2
(45) Date of Patent: Aug. 18, 2026

(54) MEMORY DEVICE

(71) Applicant: MemoRist Co., Ltd., Taipei City (TW)

(72) Inventors: Chao-Yang Chen, Taipei City (TW); Chih-Jen Huang, Taipei City (TW)

(73) Assignee: MemoRist Co., Ltd., Taipei City (TW)

(*) Notice: Subject to any disclaimer, the term of this patent is extended or adjusted under 35 U.S.C. 154(b) by 726 days.

(21) Appl. No.: 17/979,059

(22) Filed: Nov. 2, 2022

(65) Prior Publication Data

US 2023/0148003 A1 May 11, 2023

(30) Foreign Application Priority Data

Nov. 8, 2021 (TW) ................................ 110141441

(51) Int. Cl.
*H10B 99/00* (2023.01)
*G11C 5/06* (2006.01)

(52) U.S. Cl.
CPC ............ *H10B 99/00* (2023.02); *G11C 5/063* (2013.01)

(58) Field of Classification Search
CPC ........ H10B 99/00; H10B 53/30; H10B 63/30; G11C 5/063; H01L 23/5386; H01L 21/76895
See application file for complete search history.

(56) References Cited

U.S. PATENT DOCUMENTS

2003/0170954 A1* 9/2003 Rudeck ................ H10D 64/685 257/E21.507
2007/0087523 A1* 4/2007 Yeh ........................ H10B 43/40 257/E21.679
2016/0005792 A1* 1/2016 Ueki .................... H10N 70/826 257/4
2016/0233333 A1 8/2016 Toh et al.
2018/0012657 A1 1/2018 Shih et al.
2019/0067368 A1 2/2019 Tahmasebi et al.
2020/0303460 A1 9/2020 Yao et al.
2021/0066591 A1 3/2021 Trinh et al.

FOREIGN PATENT DOCUMENTS

CN 107039346 A 8/2017
CN 112447904 A 3/2021
TW 201813060 A 4/2018

* cited by examiner

*Primary Examiner* — Norman D Richards
*Assistant Examiner* — Ethan Edward Cutler
(74) *Attorney, Agent, or Firm* — Li & Cai Intellectual Property (USA) Office

(57) ABSTRACT

A memory device and a method of manufacturing the same are provided. The memory device includes a substrate, a memory cell array, and a memory cell interconnection structure. The memory cell array is disposed on the substrate and includes a plurality of memory cells. Each of the plurality of memory cells includes a transistor unit and a memory unit that are electrically connected to each other. The memory cell interconnection structure is disposed on the substrate, and is configured to establish an electrical connection between the plurality of memory cells. A plurality of source lines are embedded in a dielectric layer that directly covers the substrate. Each of the plurality of source lines is disposed on the substrate, and comes in direct contact with a source region of a corresponding one of the transistor units.

6 Claims, 16 Drawing Sheets

MEMORY DEVICE

CROSS-REFERENCE TO RELATED PATENT APPLICATION

This application claims the benefit of priority to Taiwan Patent Application No. 110141441, filed on Nov. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a memory device and a method of manufacturing the same, and more particularly to a random access memory device and a method of manufacturing the same.

BACKGROUND OF THE DISCLOSURE

Currently, a new generation of non-volatile memory components has been actively developed in the relevant industry. However, taking a resistive random access memory (resistive RAM) as an example, although the resistive RAM itself can be reduced to a nanometer scale, additional circuits are still required. As a result, it is difficult to further reduce the size of a memory cell.

SUMMARY OF THE DISCLOSURE

In response to the above-referenced technical inadequacy, the present disclosure provides a memory device and a method of manufacturing the same.

In one aspect, the present disclosure provides a memory device, which includes a substrate, a memory cell array, and a memory cell interconnection structure. The memory cell array is disposed on the substrate, and includes a plurality of memory cells. Each of the plurality of memory cells includes a transistor unit and a memory unit. The transistor unit includes a source region, a drain region, and a gate structure. The memory unit is electrically connected to the transistor unit. The memory cell interconnection structure is disposed on the substrate, and is configured to establish an electrical connection between the plurality of memory cells. The memory cell interconnection structure includes a dielectric layer and a plurality of source lines. The dielectric layer directly covers the substrate and the transistor units. The plurality of source lines are disposed on the substrate and extend along a first direction. Each of the plurality of source lines is embedded in the dielectric layer and comes in direct contact with the source region of a corresponding one of the transistor units.

In another aspect, the present disclosure provides a method of manufacturing a memory device, which includes: forming a plurality of transistor units that are arranged in an array on a substrate; and forming a memory cell interconnection structure and a plurality of memory units. The plurality of transistor units are arranged in a plurality of rows in a first direction, and each of the plurality of transistor units includes a drain region, a gate structure, and a source region that are arranged along a second direction. The plurality of memory units are respectively and electrically connected to the plurality of transistor units through the memory cell interconnection structure. The step of forming the memory cell interconnection structure at least includes: forming a dielectric layer on the substrate and a plurality of source lines embedded in the dielectric layer. Each of the plurality of source lines extends along the first direction, and comes in direct contact with the source regions of the transistor units in a corresponding one of the rows.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
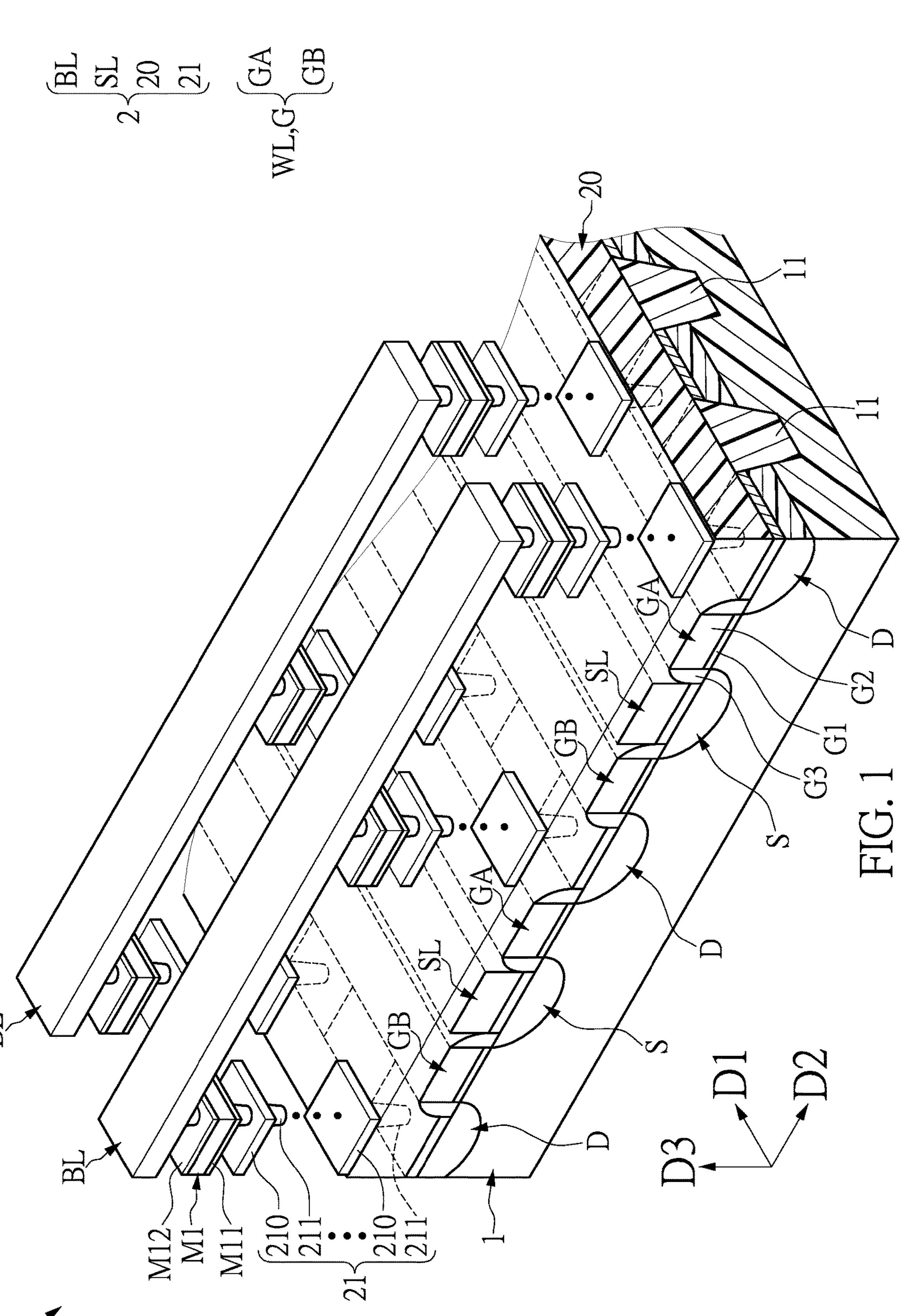
FIG. 1 is a partial schematic perspective view of a memory device according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

EMBODIMENTS

Figure 2:
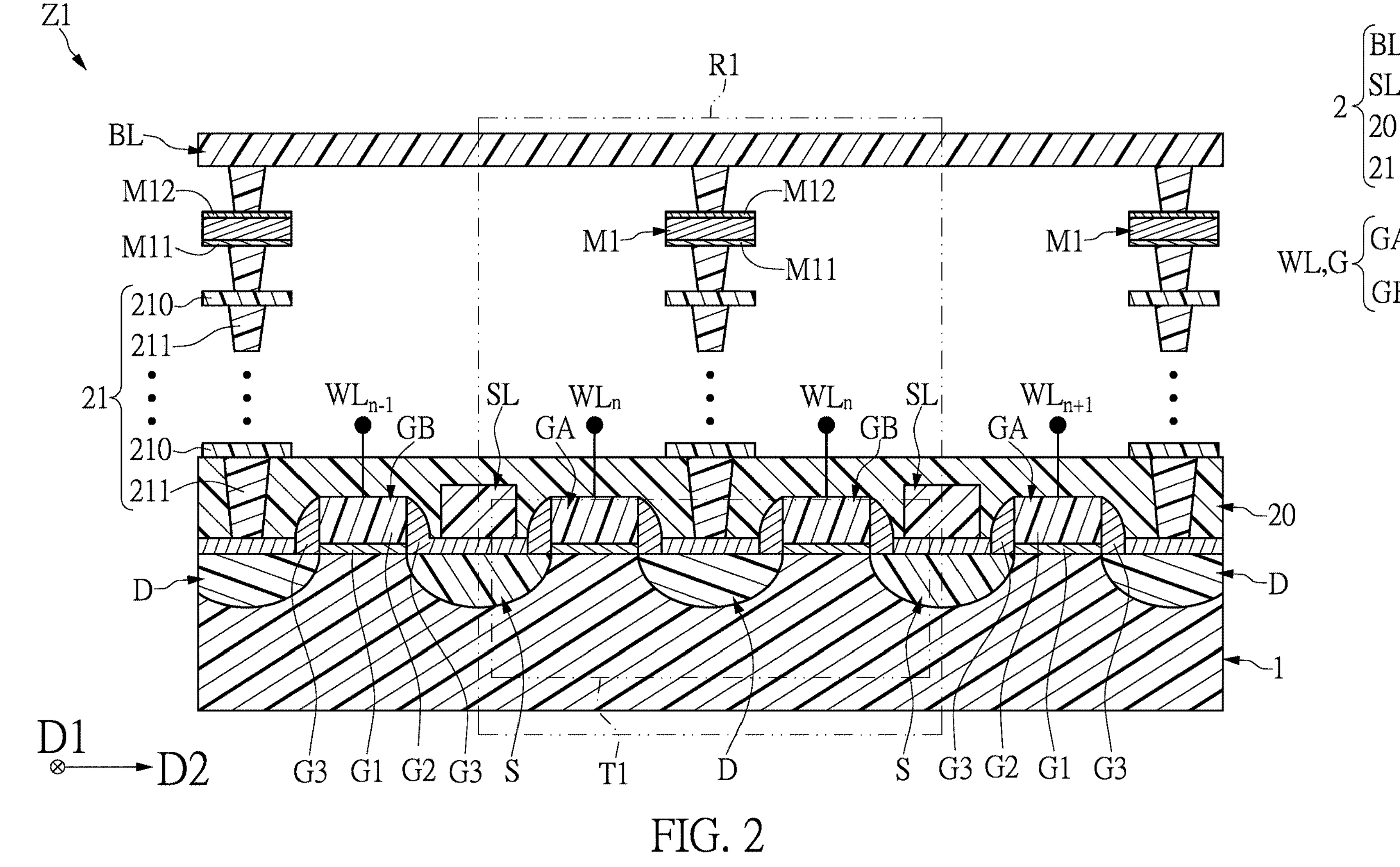
FIG. 2 is a partial cross-sectional view of the memory device according to one embodiment of the present disclosure.

Referring to FIG. 1 and FIG. 2, one embodiment of the present disclosure provides a memory device Z1. The memory device Z1 of the embodiment of the present disclosure includes a substrate 1, a memory cell array, and a memory cell interconnection structure 2.

The substrate 1 can be a semiconductor substrate or a semiconductor on insulator (SOI) substrate. Further, referring to FIG. 2, the memory cell array is disposed on the substrate 1, and includes a plurality of memory cells R1 (one memory cell R1 is exemplarily illustrated in FIG. 2). Each of the plurality of memory cells R1 includes a transistor unit T1 and a memory unit M1.

As shown in FIG. 1 and FIG. 2, the transistor units T1 are arranged in an array and disposed on the substrate 1, and each of the transistor units T1 includes a source region S, a drain region D, and a gate structure G. It should be noted that the transistor unit T1 of the embodiments of the present disclosure can be an N-type metal-oxide-semiconductor (NMOS) field effect transistor or a P-type metal-oxide-semiconductor (PMOS) field effect transistor, but the present disclosure is not limited thereto. As long as the transistor unit T1 is able to be operated with the memory unit M1, the type of the transistor unit T1 is not limited in the present disclosure.

Referring to FIG. 1 and FIG. 2, the source regions S and the drain regions D are correspondingly formed in the substrate 1, and the gate structures G are disposed on the substrate 1. In the present embodiment, the substrate 1 also includes a plurality of isolation structures 11, and each of the plurality of isolation structures 11 extends along a second direction D2, so as to separate two adjacent ones of the transistor units T1 that are arranged along a first direction D1. Further, each of the plurality of isolation structures 11 can be a shallow trench isolation (STI) structure, and the isolation structure 11 extends downward from a surface of the substrate 1 to an interior of the substrate 1.

As shown in FIG. 1 and FIG. 2, the drain region D and the source region S are separate from each other in the substrate 1, such that a channel region (not labeled in the figures) is defined therebetween. Further, the gate structure G is disposed on the substrate 1 at a position that corresponds to the channel region. That is, the gate structure G overlaps with at least one of the channel regions.

In the present embodiment, the gate structures G of the transistor units T1 that are arranged along the first direction D1 are connected to each other, so as to form a common gate line that extends along the first direction D1. The common gate line can serve as a word line. In the present embodiment, each of the gate structures G includes a first gate stack portion GA and a second gate stack portion GB. As shown in FIG. 1 and FIG. 2, the first gate stack portion GA and the second gate stack portion GB are spaced apart from each other, and are respectively arranged on opposite sides of the drain region D. Further, the first gate stack portion GA and the second gate stack portion GB overlap with two different channel regions, respectively.

Each of the first gate stack portion GA and the second gate stack portion GB includes a gate insulation layer G1, a gate electrode G2, and two spacer portions G3. The gate insulation layer G1 is arranged between the gate electrode G2 and the substrate 1, and the two spacer portions G3 respectively cover opposite side surfaces of the gate electrode G2. In the present embodiment, a material of the gate electrode G2 can be, for example, but not limited to, a heavily doped semiconductor, metal, alloy, or any combination thereof.

It is worth mentioning that, as shown in FIG. 2, the gate electrode G2 of the first gate stack portion GA is electrically connected to the gate electrode G2 of the second gate stack portion GB for controlling whether or not to simultaneously generate inversion currents in the two channel regions respectively under the first gate stack portion GA and the second gate stack portion GB. Accordingly, the transistor unit T1 can be allowed to apply a higher operating current to the memory unit M1 that is electrically connected thereto, but the present disclosure is not limited thereto. In another embodiment, the gate structure G can also include only one gate stack portion, and the transistor unit T1 can still operate in conjunction with the memory unit M1.

In addition, the first gate stack portion GA and the second gate stack portion GB extend along the first direction D1, so as to form two common gate lines. Accordingly, the two common gate lines formed by the first gate stack portion GA and the second gate stack portion GB can be regarded as a same word line WL (e.g., a word line $WL_n$), so that a same operating signal is provided thereto.

Referring to FIG. 2, each of the memory units M1 can include a lower electrode M11 and an upper electrode M12. For each of the memory units M1, the memory unit M1 is electrically connected to the transistor unit T1. A structure for establishing the electrical connection between the memory unit M1 and the transistor unit T1 will be described in detail below. By controlling a switch of the transistor unit T1 and a bias voltage that is applied to the memory unit M1, a write-in state of the memory unit M1 (e.g., enabling the memory unit M1 to have a high resistance or a low resistance) can be modulated. Through reading a resistance value of the memory unit M1, the write-in state ("0" or "1") of the memory unit M1 can be obtained. For example, when the memory unit M1 has a high resistance value, the write-in state of the memory unit M1 is "0". When the memory unit M1 has a low resistance value, the write-in state of the memory unit M1 is "1". However, the present disclosure is not limited thereto.

Each of the memory units M1 can be, but is not limited to, a resistive random access memory (resistive RAM), a conductive bridging random access memory (conductive bridging RAM), a magnetoresistive random access memory (MRAM), a phase change random access memory (PCRAM), a ferroelectrical random access memory (FeRAM), or any other type of memory that can work with the transistor unit T1.

As shown in FIG. 1 and FIG. 2, in the memory device Z1 of the embodiments of the present disclosure, the memory cell interconnection structure 2 is disposed on the substrate 1 and is configured to establish an electrical connection between the plurality of memory cells R1 of the memory cell array. The memory cell interconnection structure 2 of the present embodiment includes a dielectric layer 20 and a plurality of source lines SL.

The dielectric layer 20 is disposed on the substrate 1, and the dielectric layer 20 directly covers the substrate 1 and the transistor units T1. In the present embodiment, the dielectric layer 20 covers the gate structure G of each of the transistor units T1. Further, a top surface of the dielectric layer 20 is higher than a top of the gate structure G.

Referring to FIG. 1, the plurality of source lines SL are disposed on the substrate 1. It is worth mentioning that, instead of being arranged above the dielectric layer 20, the plurality of source lines SL and the gate structure G of the transistor unit T1 are jointly embedded in the dielectric layer 20. Further, each of the plurality of source lines SL comes directly in contact with the source region S of a corresponding one of the transistor units T1. In other words, in the embodiments of the present disclosure, each of the plurality of source lines SL is not electrically connected to the source region S of the transistor unit T1 through any conductive plug, but is directly formed on the substrate 1.

Accordingly, in the embodiments of the present disclosure, each of the plurality of source lines SL extends along the first direction D1, so that the source regions S of the transistor units T1 in a same row are electrically connected to each other through the source line SL. In addition, in the present embodiment, a top surface of each of the plurality of source lines SL is higher than the top of the gate structure G (as shown in FIG. 2).

Furthermore, since an extension direction of each of the plurality of source lines SL (i.e., the first direction D1) is different from an extension direction of each of the plurality of isolation structures 11 (i.e., the second direction D2), each of the plurality of source lines SL intersects with each of the plurality of isolation structures 11. That is, each of the plurality of source lines SL overlaps with and is connected to each of the plurality of isolation structures 11.

In the embodiments of the present disclosure, the plurality of source lines SL that are embedded in the dielectric layer 20 still pass through an electrically conductive structure arranged above the dielectric layer 20 and are electrically connected to an external control circuit. However, compared to the conventional technology, conductive plugs between the source line SL and the source region S are omitted in the embodiments of the present disclosure, so that a quantity of the conductive plugs disposed in the dielectric layer 20 can be significantly reduced. In this way, a space required for placement of the conductive plugs can be saved. In addition, since the plurality of source lines SL and the gate structure G are co-located on the substrate 1, no space is required to be reserved for wiring of the source lines SL.

According to the above, under a circumstance where manufacturing requirements are met, an overall size of the plurality of memory cells R1 can be reduced, and a density of the plurality of memory cells R1 can be increased. More specifically, in two transistor units T1 that are arranged along the second direction D2 and adjacent to each other (as shown in FIG. 2), a distance between two adjacent gate structures G can be further reduced, thereby allowing the plurality of memory cells R1 to have a smaller size.

Referring to FIG. 1 and FIG. 2, the memory cell interconnection structure 2 further includes a plurality of drain conductive structures 21 and a plurality of bit lines BL. Each of the plurality of drain conductive structures 21 is connected between the lower electrode M11 of a corresponding one of the memory units M1 and the drain region D of a corresponding one of the transistor units T1. That is, the memory unit M1 of each of the plurality of memory cells R1 can be correspondingly and electrically connected to the transistor unit T1 through the drain conductive structure 21.

Specifically, the drain conductive structure 21 includes one or more connection pads 210 and one or more conductive pillars 211. The connection pad 210 is disposed on the dielectric layer 20, and the conductive pillar 211 extends downward from the top surface of the dielectric layer 20 to the substrate 1, so that the connection pad 210 can be electrically connected to the drain region D of the transistor unit T1. In the embodiment as shown in FIG. 1 and FIG. 2, the drain conductive structure 21 includes multiple connection pads 210 and multiple conductive pillars 211. It should be noted that the multiple connection pads 210 and multiple insulation layers (not shown in the figures) may be alternately stacked with each other along a third direction D3.

That is, two vertically adjacent connection pads 210 of the drain conductive structure 21 are separated from each other by one insulation layer, and each of the conductive pillars 211 passes through a corresponding one of the insulation layers, so as to correspondingly connect the two vertically adjacent connection pads 210. A quantity of the connection pads 210 and a quantity of the conductive pillars 211 can be adjusted according to practical requirements, and are not limited in the present disclosure.

Referring to FIG. 1 and FIG. 2, the plurality of bit lines BL extend along the second direction D2, and each of the plurality of bit lines BL is electrically connected to a corresponding one of the memory units M1. More specifically, each of the plurality of bit lines BL is electrically connected to the upper electrode M12 of the corresponding one of the memory units M1. It should be noted that, in the present embodiment, an extension direction of each of the plurality of bit lines BL is not parallel to the extension direction of each of the plurality of source lines SL.

The plurality of bit lines BL, the plurality of source lines SL, and a plurality of word lines WL are correspondingly and electrically connected to the external control circuit (not shown in the figures). Further, the external control circuit provides a control signal to the selected word line WL, the selected bit line BL, and the selected source line SL, so that a property (e.g., the resistance value) of the selected memory unit M1 of the memory cell R1 can be modulated for writing data.

Figure 3:
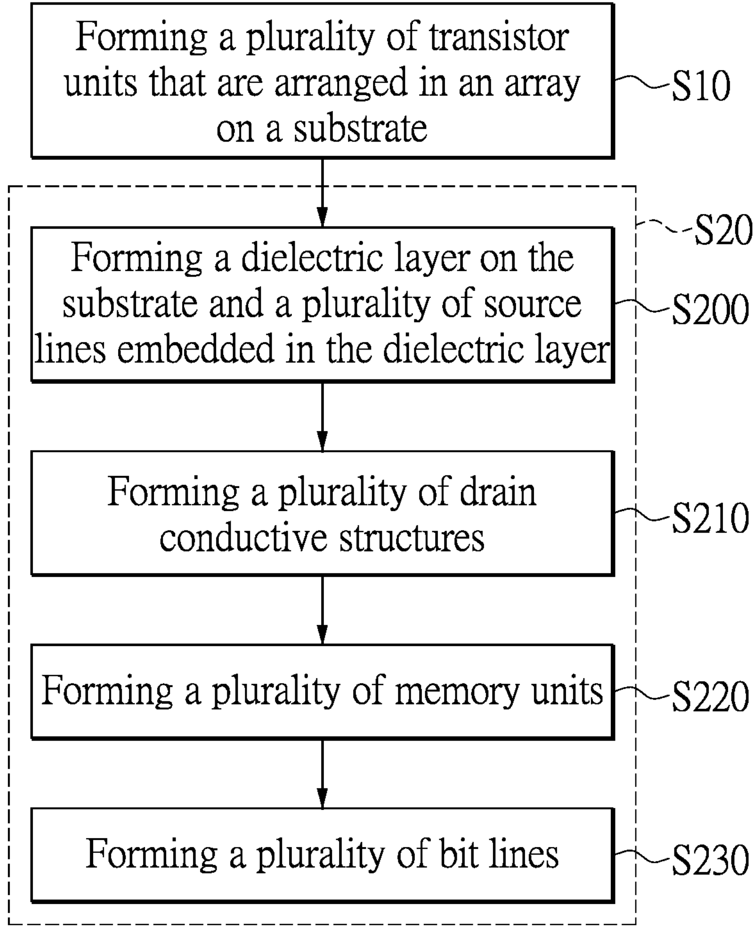
FIG. 3 is a flowchart of a method of manufacturing the memory device according to one embodiment of the present disclosure.

Referring to FIG. 3, a flowchart of a method of manufacturing the memory device according to one embodiment of the present disclosure is shown. In step S10, a plurality of transistor units are formed in an array on a substrate. The formation of the transistor unit T1 as shown in FIG. 2 is taken as an example in the following description.

Figure 4:
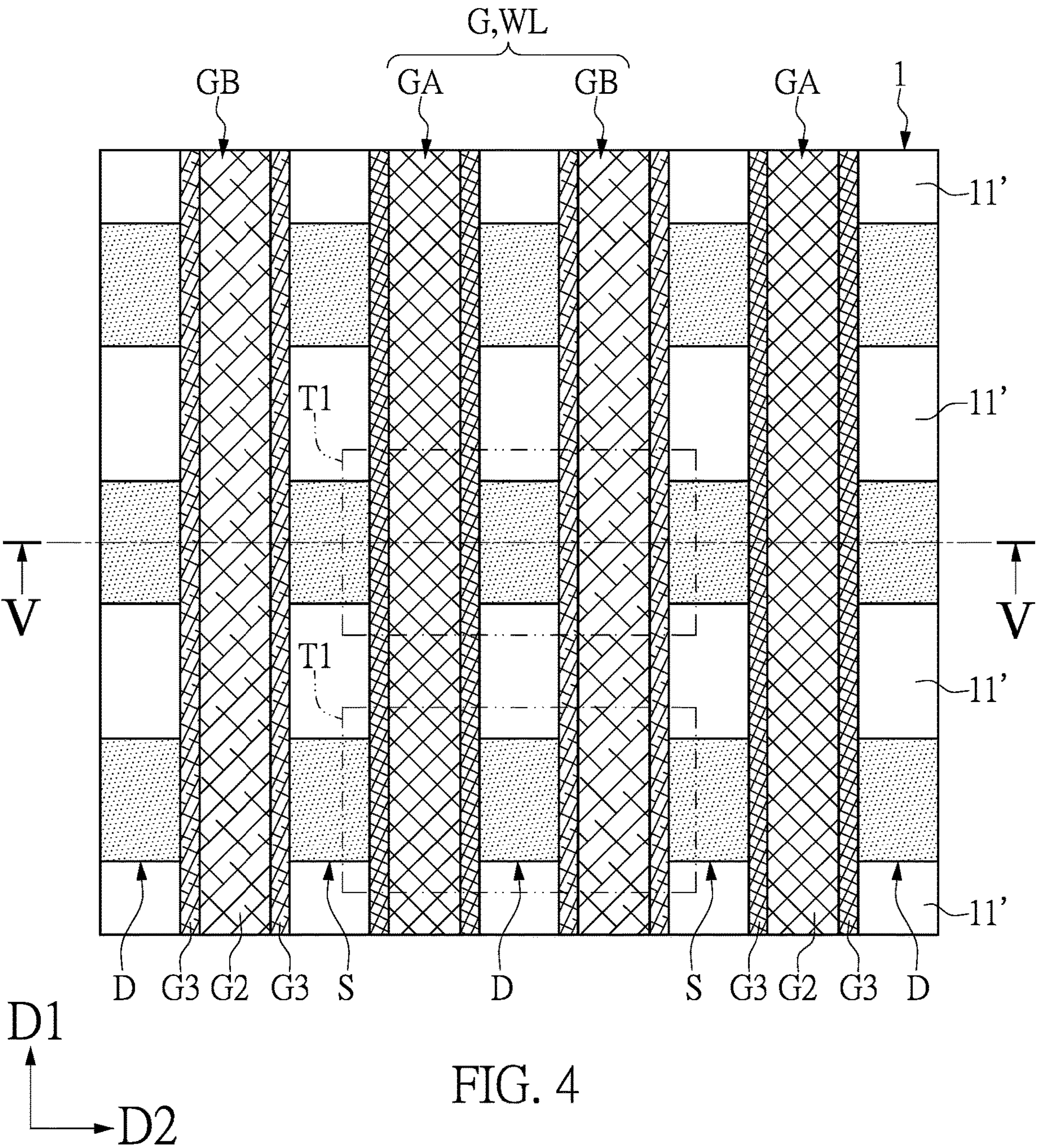
FIG. 4 is a schematic top view of the memory device during step S10 of the method according to one embodiment of the present disclosure.

With reference to FIG. 4, a plurality of transistor units T1 are arranged in the array on a substrate 1. The plurality of transistor units T1 can be formed through a conventional semiconductor manufacturing process, but the present disclosure is not limited thereto. Further, the plurality of transistor units T1 are arranged in multiple rows along a first direction D1. Each of the plurality of transistor units T1 includes a drain region D, a gate structure G, and a source region S that are arranged along a second direction D2.

Figure 5:
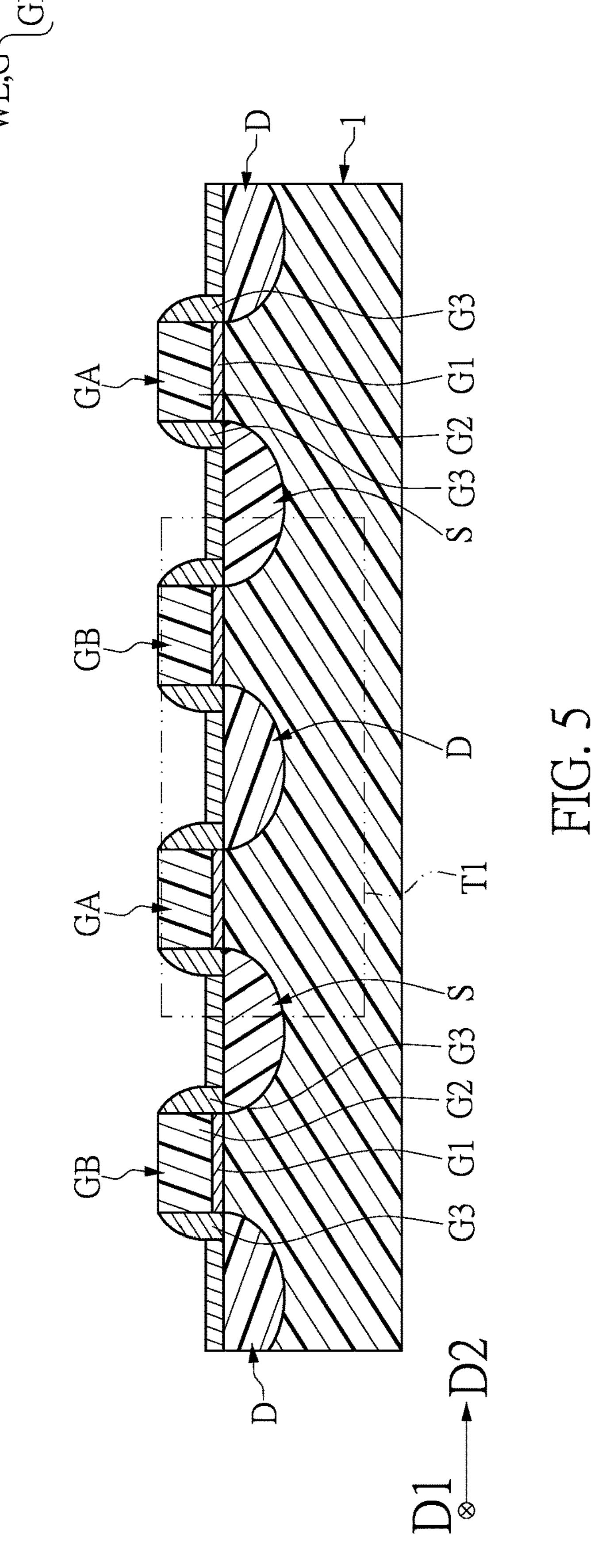
FIG. 5 is a schematic cross-sectional view taken along line V-V of FIG. 4.

In the embodiments of the present disclosure, the gate structure G is disposed on the substrate 1, and the drain region D and the source region S are formed in the substrate 1. As shown in FIG. 4 and FIG. 5, multiple drain regions D and multiple source regions S that are formed in the substrate 1 are alternately arranged along the second direction D2, and any two adjacent ones of the drain regions D and the source regions S are spaced apart from each other, so as to define multiple channel regions. Multiple gate structures G are disposed on the substrate 1 at positions that correspond to the multiple channel regions. In addition, in one particular embodiment (as shown in FIG. 5), a metallic silicide layer (not labeled in the figures) can be pre-formed on the source region S and the drain regions D.

As shown in FIG. 4, the gate structures G of the transistor units T1 in a same row are connected to each other to form a common gate line that extends along the first direction D1. The common gate line can serve as a word line WL. In the present embodiment, each of the gate structures G can include a first gate stack portion GA and a second gate stack portion GB, and the first gate stack portion GA and the second gate stack portion GB are respectively arranged on opposite sides of the drain region D, but the present is not limited thereto. Each of the first gate stack portion GA and the second gate stack portion GB includes a gate insulation layer G1, a gate electrode G2, and two spacer portions G3. In another embodiment, the gate structure G can also include only one gate stack portion.

In addition, the step of forming the plurality of transistor units T1 in the array further includes: forming a plurality of isolation structures 11' in the substrate 1. A material of the isolation structure 11' is an insulation material. As shown in FIG. 4, the plurality of isolation structures 11' extend along the second direction D2, so as to separate two adjacent ones of the transistor units T1 that are arranged along the first direction D1. Since an extension direction of the plurality of isolation structures 11' is different from an extension direction of the common gate lines, each of the common gate lines partially overlaps with the plurality of isolation structures 11'. In addition, each of the plurality of isolation structures 11' extends downward from a top surface of the substrate 1 to an interior of the substrate 1.

Referring to FIG. 3, a memory cell interconnection structure and a plurality of memory units are formed in step S20. As described above, the plurality of memory units are respectively and electrically connected to the plurality of transistor units T1 through the memory cell interconnection structure. Further, the step of forming the memory cell interconnection structure and the plurality of memory units includes the following steps.

Step S200 is to form a dielectric layer on the substrate and a plurality of source lines embedded in the dielectric layer.

Step S210 is to form a plurality of drain conductive structures.

Step S220 is to form the plurality of memory units.

Step S230 is to form a plurality of bit lines.

Figure 6:
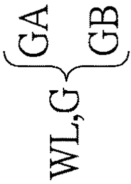
FIG. 6 is a schematic cross-sectional view of the memory device during a step of forming a primary flat layer according to one embodiment of the present disclosure.
Figure 6:
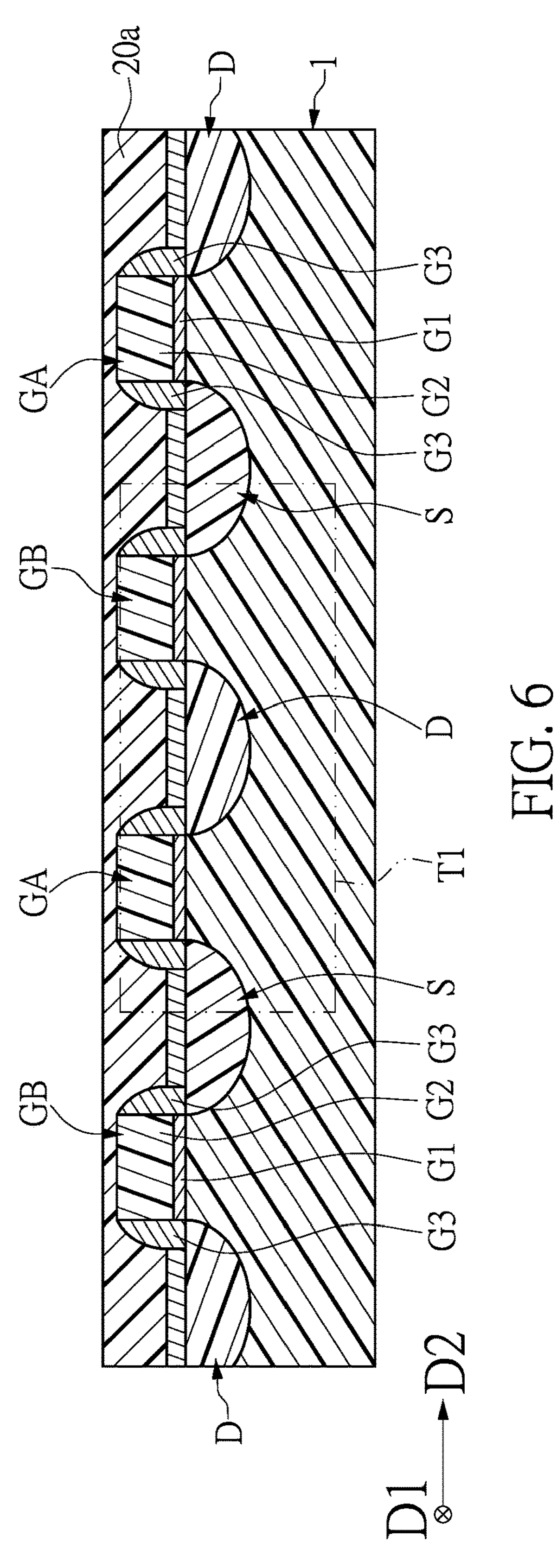

Detailed steps of forming a dielectric layer 20 and a plurality of source lines SL are further described in the following description. Referring to FIG. 6, a primary flat layer 20*a* is formed so as to cover the plurality of transistor units T1, and a top surface of the primary flat layer 20*a* is a flat surface. A material of the primary flat layer 20*a* can be oxide, nitride, or nitrogen oxide, but the present disclosure is not limited thereto. In addition, as shown in FIG. 6, a height of the top surface of the primary flat layer 20*a* relative to a surface of the substrate 1 is higher than a height of a top of the gate structure G relative to the surface of the substrate 1. That is, the primary flat layer 20*a* completely covers the plurality of gate structures G.

Figure 7:
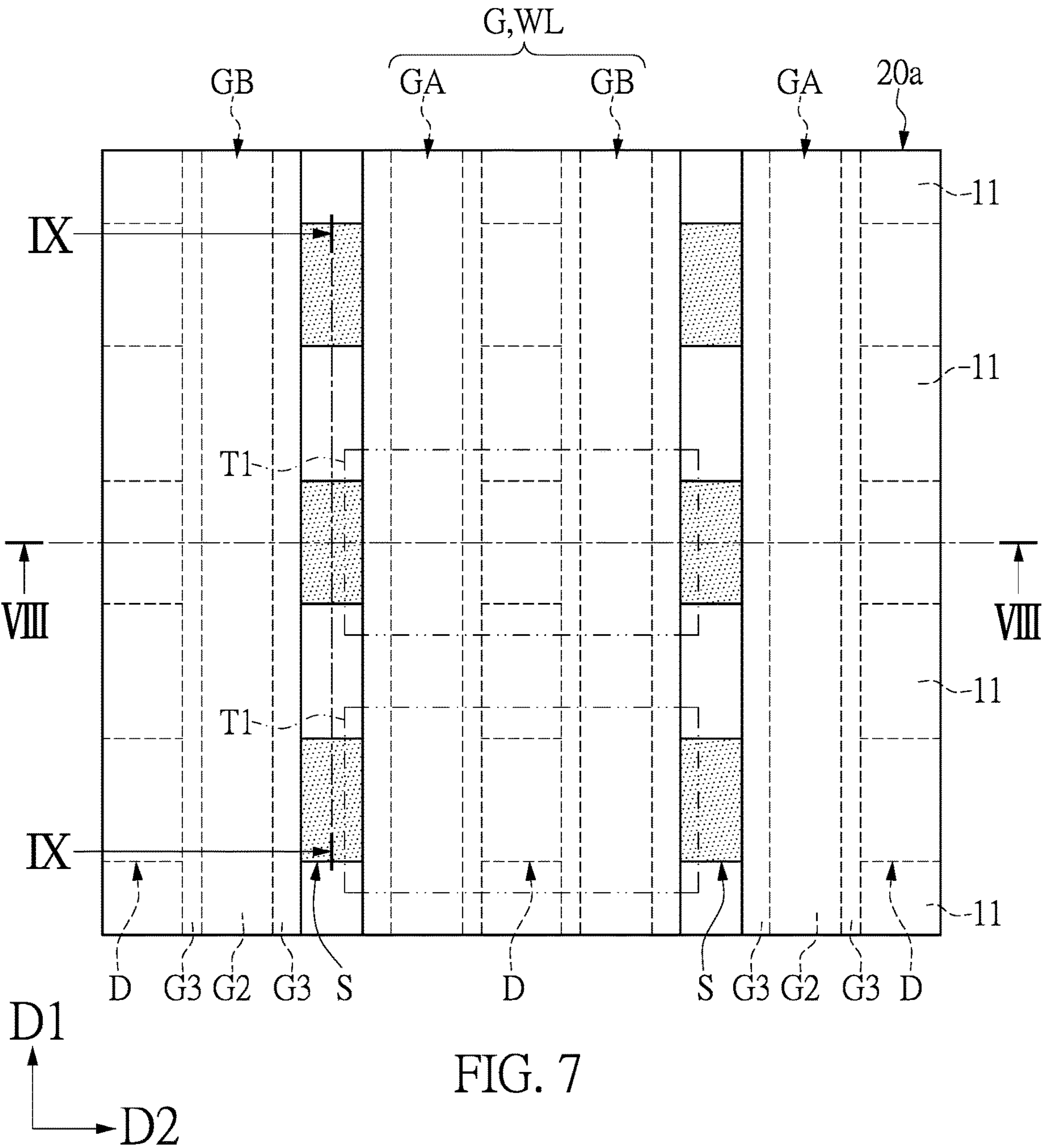
FIG. 7 is a schematic top view of the memory device during a step of forming a plurality of source grooves according to one embodiment of the present disclosure.
Figure 8:
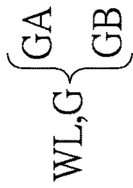
FIG. 8 is a schematic cross-sectional view taken along line VIII-VIII of FIG. 7.
Figure 8:
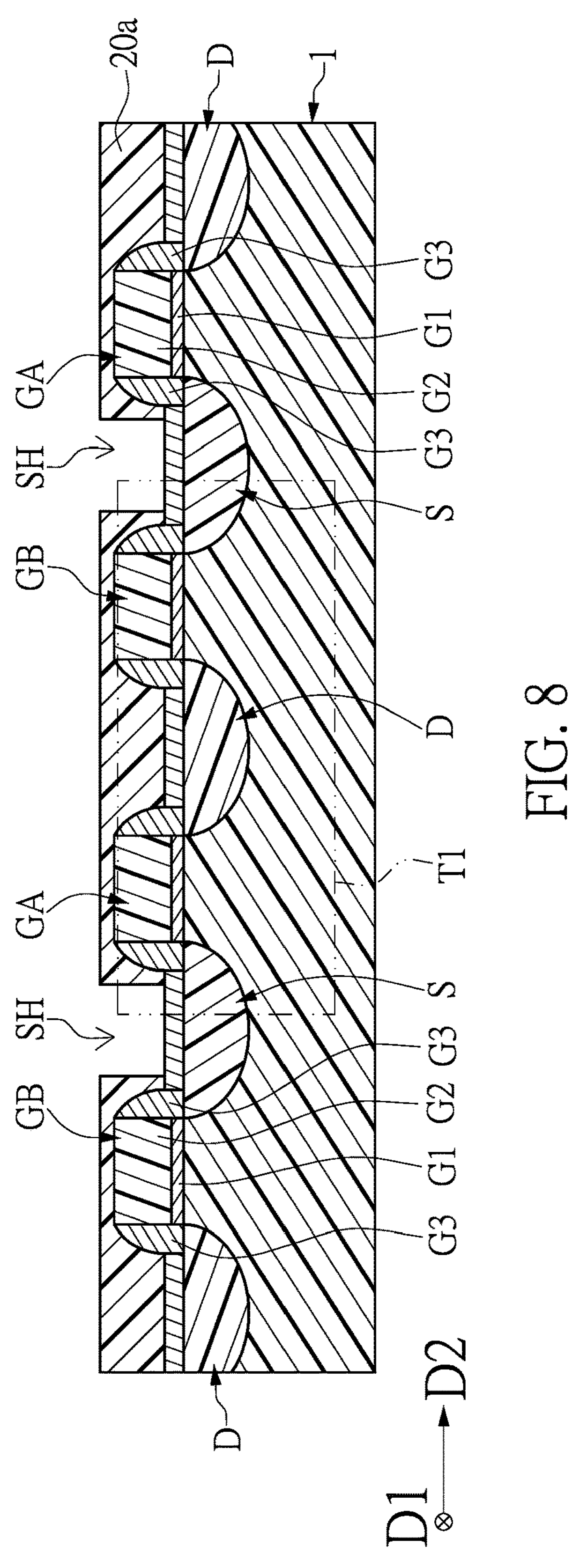
Figure 9:
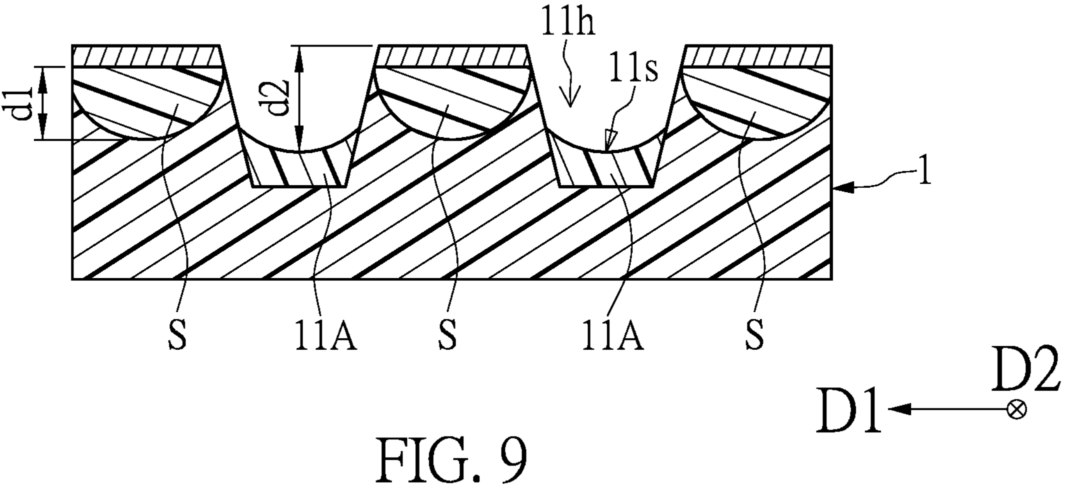
FIG. 9 is a schematic cross-sectional view taken along line IX-IX of FIG. 7.

Referring to FIG. 7 to FIG. 9, a plurality of source grooves SH are formed in the primary flat layer 20*a*. In one particular embodiment, the plurality of source grooves SH can be formed by a photolithography etching process. As shown in FIG. 7 and FIG. 8, each of the plurality of source grooves SH extends along the first direction D1, so as to expose the source regions S of the transistor units T1 in a corresponding one of the rows.

In addition, referring to FIG. 7 and FIG. 9, in the step of forming the plurality of source grooves SH, an isolation structure 11 under each of the plurality of source grooves SH is also etched. Referring to FIG. 9, after the plurality of source grooves SH are formed, each of the isolation structures 11 has a plurality of insulation portions 11A that remain exposed by not being covered by the primary flat layer 20*a*.

As shown in FIG. 9, a surface of each of the plurality of insulation portions 11A is concave relative to the surface of the substrate 1, so that a concave surface 11*s* is formed. Accordingly, in the step of forming the plurality of source grooves SH, a plurality of recesses 11*h* are also formed in the isolation structures 11. Each of the plurality of recesses 11*h* is connected to a corresponding one of the plurality of source grooves SH. In one particular embodiment, a depth d2 of the recess 11*h* is greater than a doping depth d1 of the source region S, but the present disclosure is not limited thereto. It should be noted that a portion of the isolation structure 11 that is covered by the primary flat layer 20*a* and the gate structure G is not etched and still has the flat surface.

Figure 10:
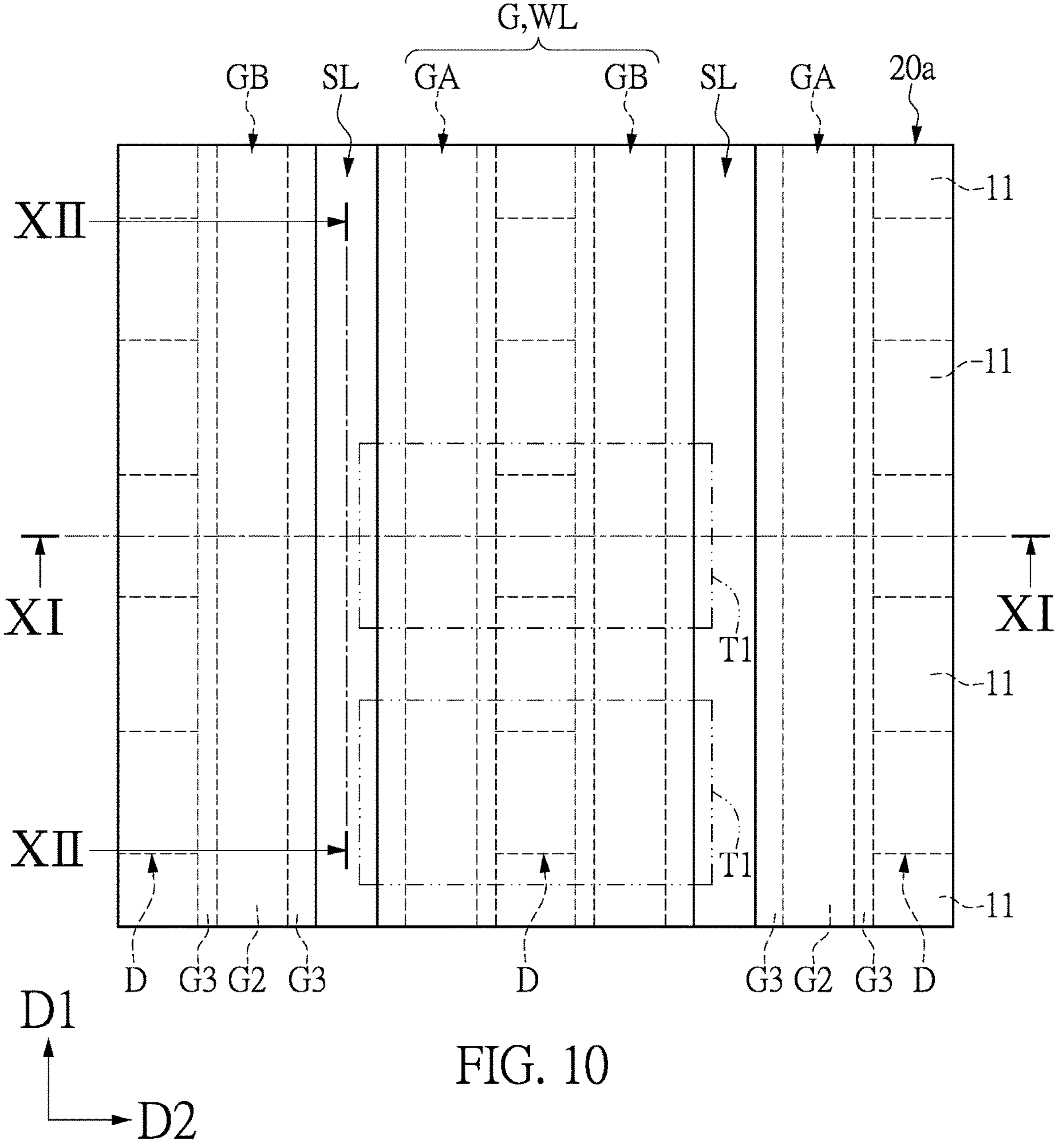
FIG. 10 is a schematic top view of the memory device during a step of forming a plurality of source lines according to one embodiment of the present disclosure.
Figure 11:
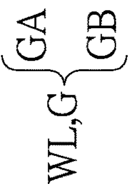
FIG. 11 is a schematic cross-sectional view taken along line XI-XI of FIG. 10.
Figure 11:
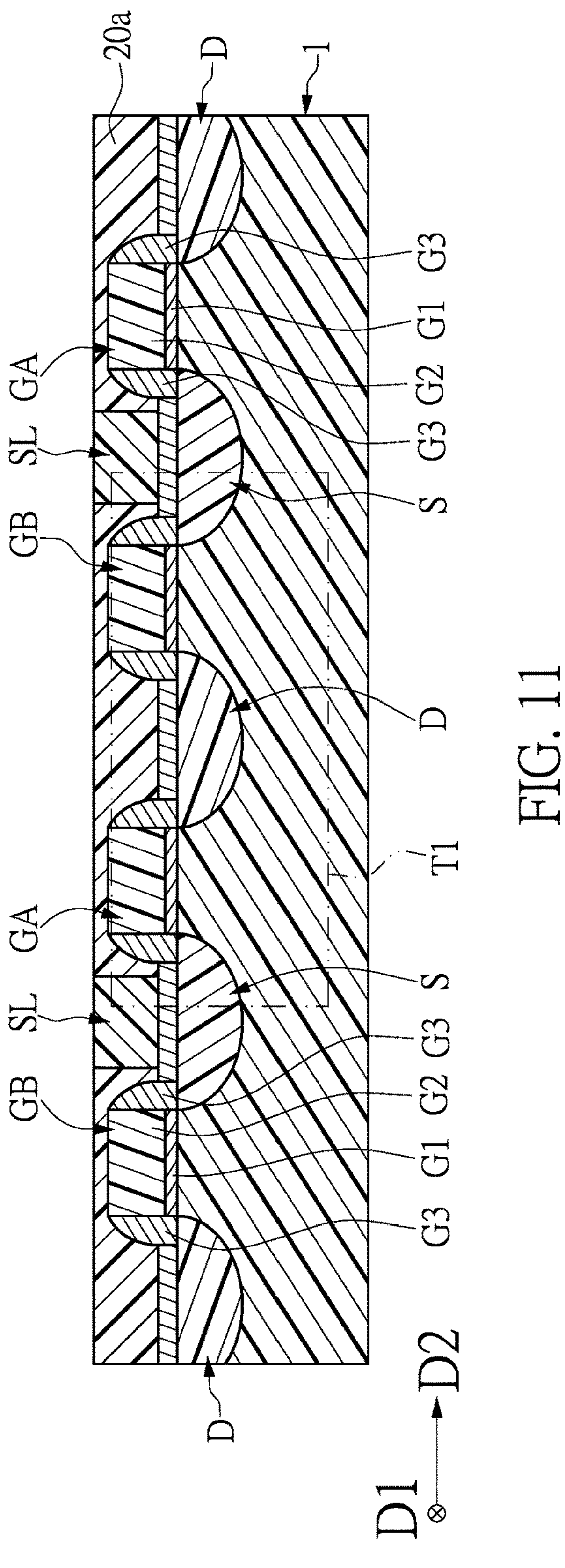
Figure 12:
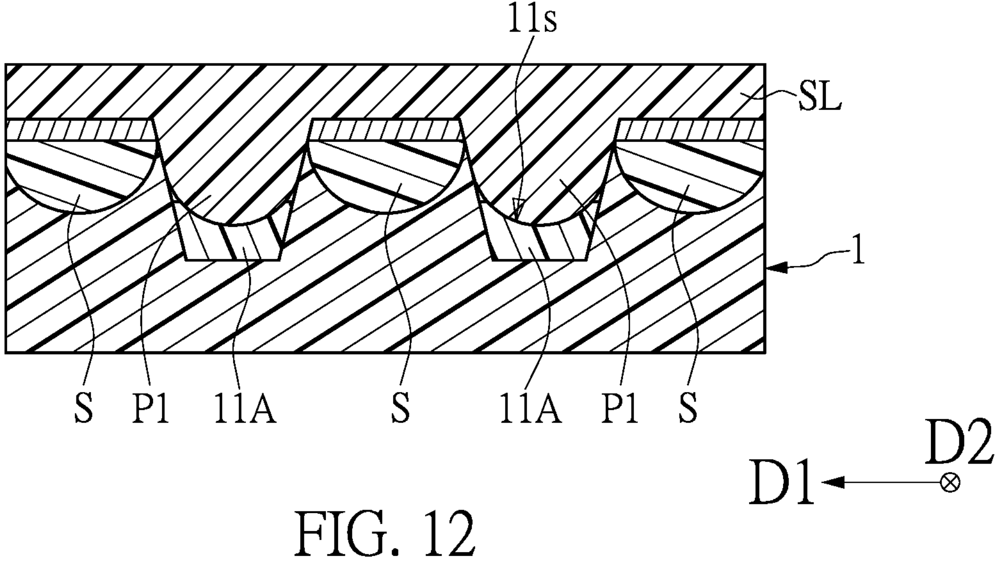
FIG. 12 is a schematic cross-sectional view taken along line XII-XII of FIG. 10.

Referring to FIG. 10 to FIG. 12, a conductive material is filled into the plurality of source grooves SH, so as to form the plurality of source lines SL. As shown in FIG. 11, in the present embodiment, each of the plurality of source lines SL can come directly in contact with the source region S of a corresponding one of the transistor units T1, and a top surface of each of the plurality of source lines SL is higher than the top of the gate structure G. Specifically, the conductive material can be formed in the plurality of source grooves SH and can cover the primary flat layer 20*a*. Afterwards, a grinding process is performed to remove the conductive material that is on the primary flat layer 20*a*, while the conductive material that is in the plurality of source grooves SH is reserved, so as to form the plurality of source lines SL. According, in the present embodiment, the top surface of each of the plurality of source lines SL is coplanar with the top surface of the primary flat layer 20*a*.

In addition, as shown in FIG. 12, when the conductive material is filled into the plurality of source grooves SH, the conductive material is also filled into the recess 11*h* of each of the isolation structures 11. Accordingly, after the step of forming the plurality of source lines SL, a plurality of projections P1 that extend into the substrate 1 are formed on each of the plurality of source lines SL. Each of the plurality of projections P1 is filled into a corresponding one of the recesses 11*h*, and is connected to the concave surface 11*s* of the insulation portion 11A.

The conductive material of each source line SL can be selected from a group consisting of metal, alloy, conductive oxide, conductive nitride, and any combination thereof. The metal can be, for example, but not limited to, tantalum (Ta), titanium (Ti), tungsten (W), ruthenium (Ru), aluminum (Al), and cobalt (Co). The alloy can be titanium tungsten (TiW), but the present disclosure is not limited thereto. The conductive oxide can be, for example, but not limited to, iridium dioxide (402) and ruthenium dioxide ($RuO_2$). In addition, the conductive nitride can be, for example, but not limited to, titanium nitride (TiN), tantalum nitride (TaN), and titanium aluminum nitride (TiAlN).

Figure 13:
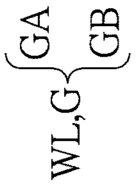
FIG. 13 is a schematic cross-sectional view of the memory device during a step of forming a cover layer according to one embodiment of the present disclosure
Figure 13:
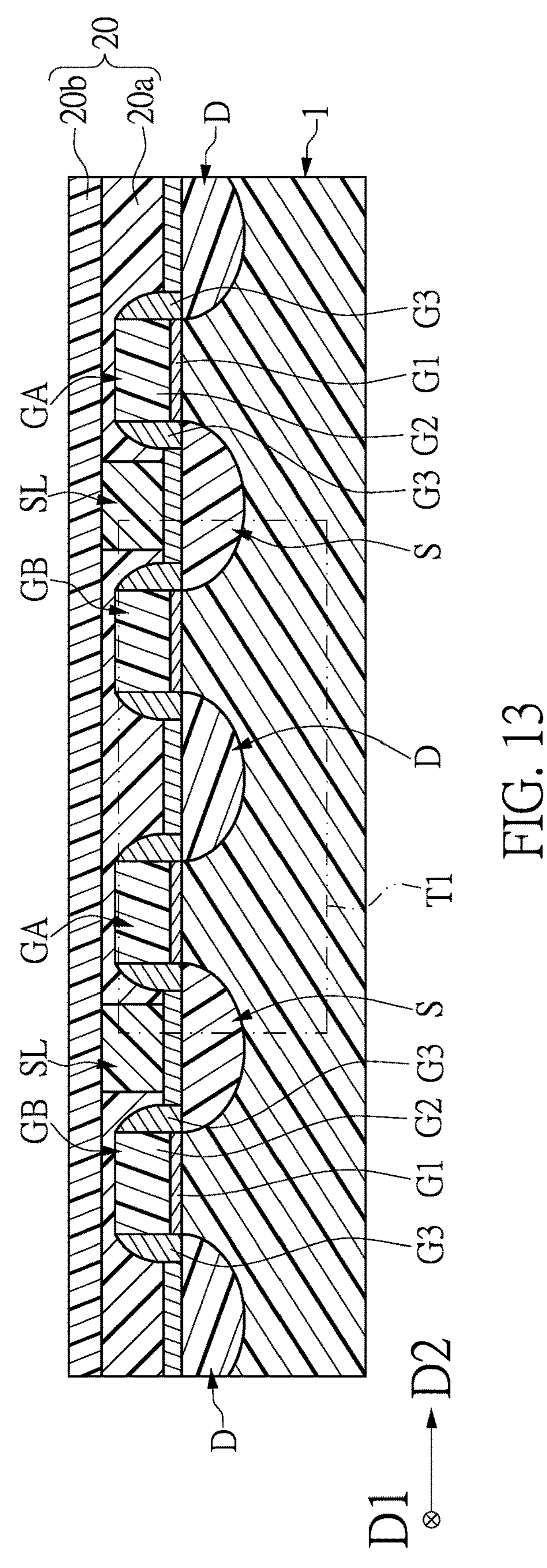

Referring to FIG. 13, a cover layer 20*b* is formed on the primary flat layer 20*a* and the plurality of source lines SL. The dielectric layer 20 is formed jointly by the cover layer 20*b* and the primary flat layer 20*a*. Accordingly, the plurality of source lines SL are embedded in the dielectric layer 20. In one particular embodiment, a material of the cover layer 20*b* is the same as the material of the primary flat layer 20*a*, but the present disclosure is not limited thereto. In another embodiment, the material of the cover layer 20*b* can also be different from the material of the primary flat layer 20*a*.

Figure 14:
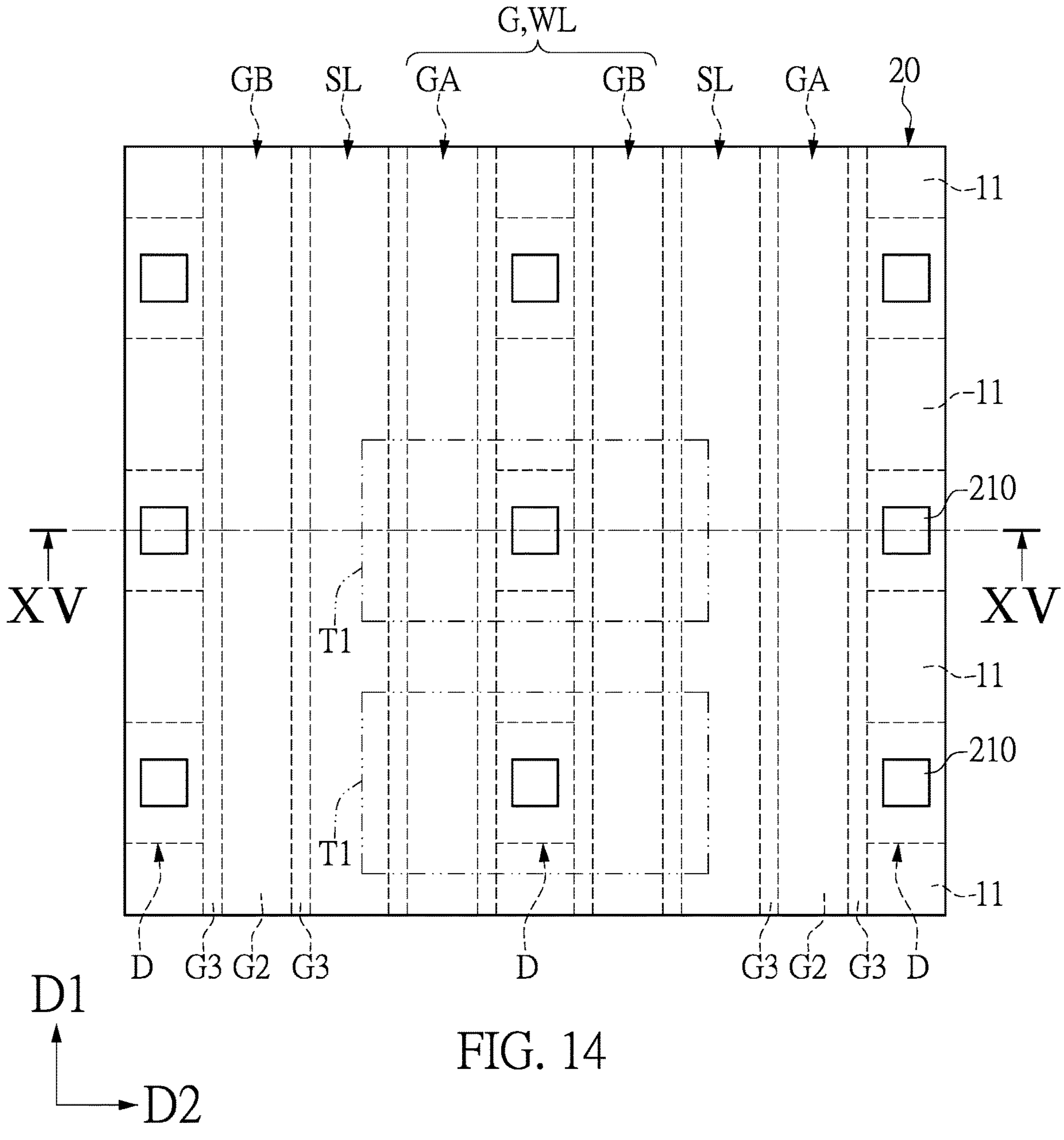
FIG. 14 is a schematic top view of the memory device during a step of forming a plurality of drain conductive structures according to one embodiment of the present disclosure.
Figure 15:
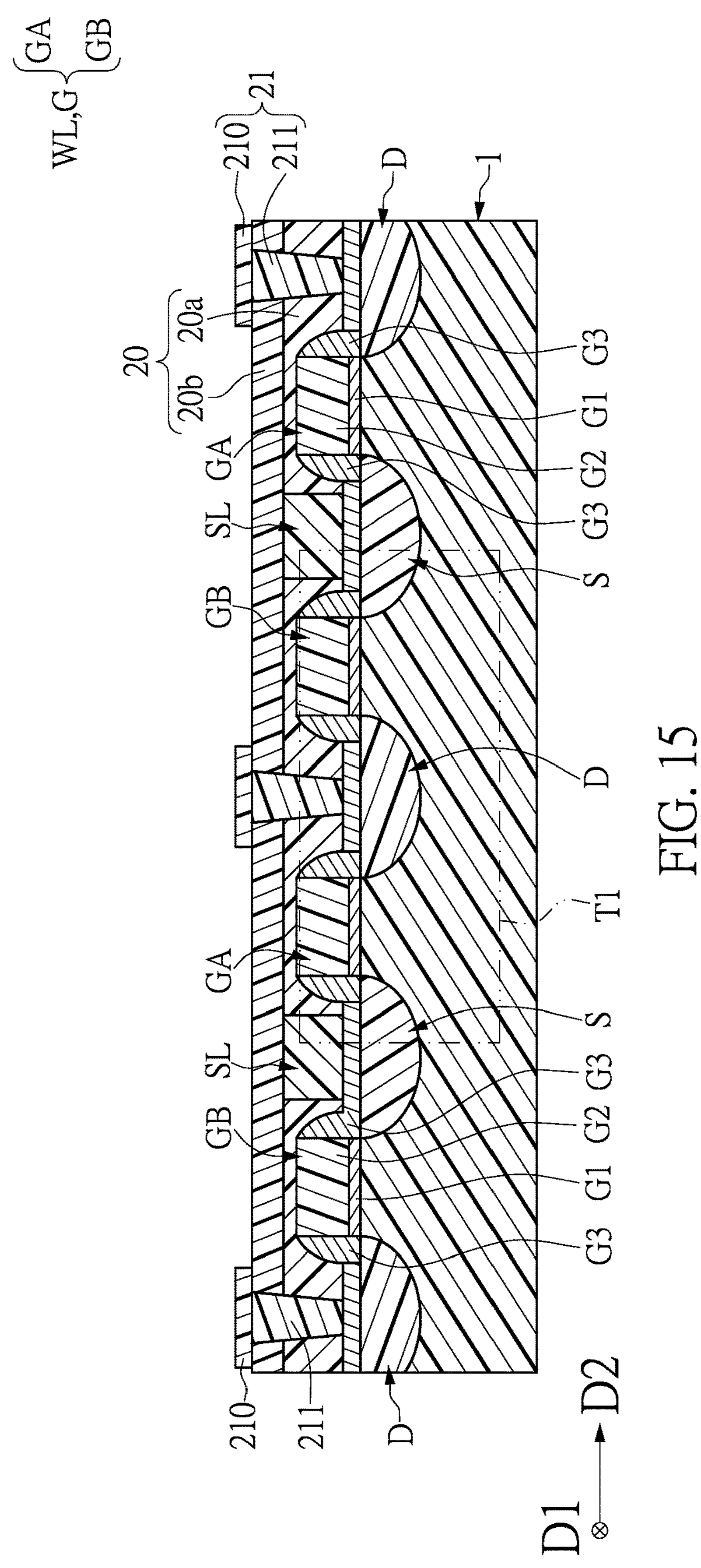
FIG. 15 is a schematic cross-sectional view taken along line XV-XV of FIG. 14.

Referring to FIG. 14 and FIG. 15, a plurality of drain conductive structures 21 are formed. Further, a plurality of conductive pillars 211 are first formed in the dielectric layer 20, and each of the plurality of conductive pillars 211 passes through the dielectric layer 20 and is connected to a corresponding one of the drain regions D. Afterwards, a plurality of connection pads 210 are formed on the dielectric layer 20, so as to be respectively connected to the plurality of conductive pillars 211. A conductive pattern layer is formed jointly by the plurality of connection pads 210 that are arranged on a top surface of the dielectric layer 20, and can be implemented in a same manufacturing process. That is, in the present disclosure, the plurality of drain conductive structures 21 are formed after the step of forming the plurality of source lines SL and the dielectric layer 20.

It is worth mentioning that, since the plurality of source lines SL of the embodiments of the present disclosure are already formed in the dielectric layer 20, a quantity of the conductive pillars in the dielectric layer 20 can be reduced, and it is not necessary to reserve a space above the dielectric layer 20 for wiring of the source lines SL. Therefore, under a circumstance where manufacturing requirements are met, an overall size of the plurality of memory cells R1 can be reduced, and a density of the plurality of memory cells R1 can be increased.

It should be noted that each of the plurality of drain conductive structures 21 can include one or more connection pads 210 and one or more conductive pillars 211. In FIG. 14 and FIG. 15, only the connection pads 210 arranged on the dielectric layer 20 and the conductive pillars 211 formed in the dielectric layer 20 are exemplarily shown to illustrate the step of forming the plurality of drain conductive structures 21, but the present disclosure is not limited thereto. In a subsequent step, multiple conductive pillars 211 and multiple connection pads 210 that are respectively connected to each other can be further formed on each of the plurality of connection pads 210.

Figure 16:
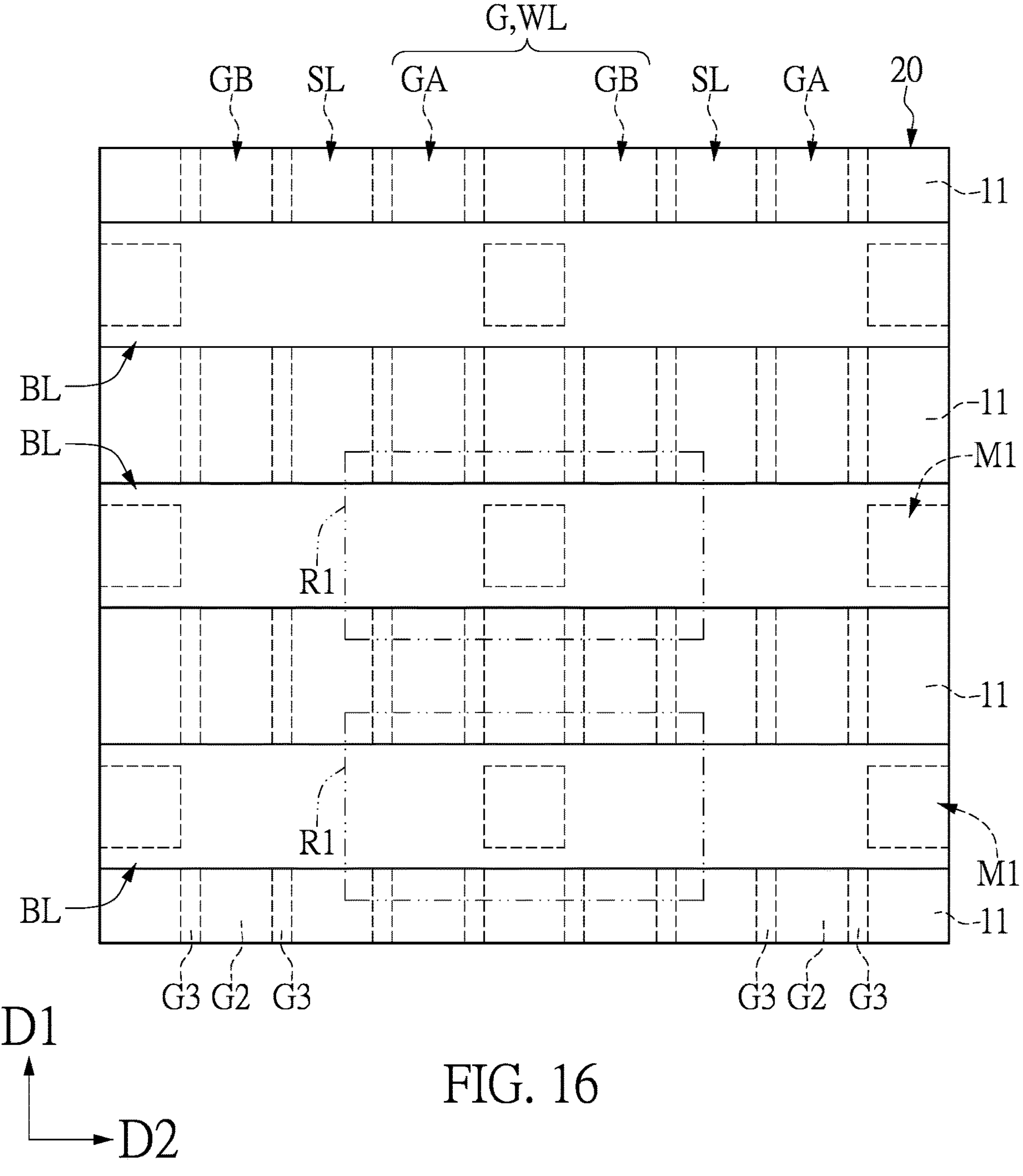
FIG. 16 is a schematic top view of the memory device during a step of forming a plurality of bit lines according to one embodiment of the present disclosure.

Referring to FIG. 16, after the step of forming the plurality of drain conductive structures 21, a plurality of memory units M1 are formed at positions corresponding to the plurality of drain conductive structures 21. Specifically, with reference to FIG. 2, a lower electrode M11 of each of the plurality of memory units M1 is electrically connected to the drain region D of a corresponding one of the plurality of transistor units T1 through the drain conductive structure 21.

Further, after the step of forming the plurality of memory units M1, a plurality of bit lines BL are formed. Each of the plurality of bit lines BL extends along the second direction D2, and is electrically connected to a corresponding one of the memory units M1. More specifically, with reference to FIG. 2, each of the plurality of bit lines BL is connected to the upper electrodes M12 of the plurality of memory units M1 of the plurality of memory cells R1 arranged along the second direction D2. As shown in FIG. 16, since the plurality of source lines SL are embedded in the dielectric layer 20 and an extension direction of the plurality of source lines SL is the same as the extension direction of the gate structure G (i.e., the word line WL), an extension direction of the plurality of bit lines BL of the present disclosure is different from the extension direction of the plurality of source lines SL.

Beneficial Effects of the Embodiments

In conclusion, in the memory device and the method of manufacturing the same provided by the present disclosure, by virtue of "each of the plurality of source lines SL being embedded in the dielectric layer 20 and coming in direct contact with the source region S of a corresponding one of the transistor units T1," the size of each of the memory cells R1 is reduced, thereby increasing the density of the memory cell array.

Further, in the embodiments of the present disclosure, by having the source lines SL embedded in the dielectric layer 20, the quantity of the conductive plugs that are disposed in the dielectric layer 20 can be significantly reduced, thereby saving the space required for placement of the conductive plugs. In addition, no space is required to be reserved for wiring of the source lines SL. Based on the above, the overall size of the memory cells R1 can be reduced and the density of the memory cells R1 can be increased. Compared with conventional one-transistor-one-memristor (1T1M) memory components, the size of the memory cells R1 can be reduced by at least 10% through the technical means of the present disclosure.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A memory device, comprising:

a substrate;

a memory cell array disposed on the substrate and including a plurality of memory cells, wherein each of the plurality of memory cells includes:

a transistor unit, wherein the transistor unit includes a source region, a drain region, and a gate structure; and a memory unit electrically connected to the transistor unit; and a memory cell interconnection structure disposed on the substrate, wherein the memory cell interconnection structure is configured to establish an electrical connection between the plurality of memory cells, and the memory cell interconnection structure includes:

a dielectric layer directly covering the substrate and the transistor units; and a plurality of source lines disposed on the substrate and extending along a first direction, wherein each of the plurality of source lines is embedded in the dielectric layer and comes in contact with the source region of a corresponding one of the transistor units;

wherein the substrate further includes a plurality of isolation structures formed in the substrate, and each of the plurality of isolation structures extends along the second direction and intersects with the plurality of source lines, so as to separate any two of the transistor units that are arranged along the first direction and adjacent to each other; wherein each of the plurality of isolation structures has a plurality of insulation portions that respectively overlap with the plurality of source lines, a surface of each of the plurality of insulation portions has a recess, a part of each of the plurality of source lines is filled into the recess of a corresponding one of the plurality of insulation portions and directly contacts the corresponding insulation portion, and a depth of each of the recesses is greater than a depth of the source region in the substrate.

2. The memory device according to claim 1, wherein the memory cell interconnection structure further includes:

a plurality of bit lines extending along a second direction, wherein each of the plurality of bit lines is connected to an upper electrode of a corresponding one of the memory units; and a plurality of drain conductive structures, wherein each of the plurality of drain conductive structures is connected to a lower electrode of a corresponding one of the memory units and the drain region of a corresponding one of the transistor units.

3. The memory device according to claim 1, wherein the transistor units of the plurality of memory cells are arranged in a plurality of rows along the first direction, and the gate structures of the transistor units in a same row are connected to each other, so as to form a common gate line that extends along the first direction.

4. The memory device according to claim 1, wherein the gate structure of the transistor unit is disposed on the substate, and includes a first gate stack portion and a second gate stack portion; wherein the first gate stack portion and the second gate stack portion are spaced apart from each other and are respectively disposed on opposite sides of the drain region; wherein the first gate stack portion is electrically connected to the second gate stack portion.

5. The memory device according to claim 1, wherein a top surface of each of the plurality of source lines is higher than a top end of the gate structure, and a material of each of the plurality of source lines is selected from a group consisting of metal, alloy, conductive oxide, conductive nitride, and any combination thereof.

6. The memory device according to claim 1, wherein the memory unit is a resistive random-access memory, a conductive bridging random access memory, a magnetoresistive random access memory, a phase change random access memory, or a ferroelectrical random access memory.

* * * * *